(12) United States Patent
Liu

(10) Patent No.: US 6,675,057 B2
(45) Date of Patent: Jan. 6, 2004

(54) INTEGRATED CIRCUIT ANNEALING METHODS AND APPARATUS

(75) Inventor: Mark Y. Liu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 190 days.

(21) Appl. No.: 09/842,389

(22) Filed: Apr. 25, 2001

(65) Prior Publication Data

US 2002/0161468 A1 Oct. 31, 2002

(51) Int. Cl.[7] .......................... G06F 19/00; B23K 26/00
(52) U.S. Cl. ................. 700/117; 700/108; 219/121.6; 219/121.85
(58) Field of Search ............................... 700/108, 117; 219/121.6, 121.85

(56) References Cited

U.S. PATENT DOCUMENTS

| | | | | |
|---|---|---|---|---|
| 3,900,737 A | * | 8/1975 | Collier et al. ............ | 250/492.2 |
| 4,131,487 A | * | 12/1978 | Pearce et al. ............. | 438/473 |
| 4,316,074 A | * | 2/1982 | Daly ....................... | 219/121.6 |
| 4,415,794 A | * | 11/1983 | Delfino et al. .......... | 219/121.85 |

\* cited by examiner

Primary Examiner—Leo Picard
Assistant Examiner—W. Russell Swindell
(74) Attorney, Agent, or Firm—Schwegman, Lundberg, Woessner & Kluth, P.A.

(57) ABSTRACT

Improved methods for performing thermal annealing of objects, such as wafers of integrated circuits (ICs), employ a scanning continuous wave laser beam. The annealing time is dependent upon the beam intensity, the beam spot size, the beam shape, and the beam dwell time, which can be effectively controlled by varying the scanning speed. A variety of different scan patterns can be used. Because the entire wafer is thermally processed by a continuously moving laser beam, annealing throughput is significantly improved over methods utilizing a stepping laser beam.

28 Claims, 9 Drawing Sheets

INTEGRATED CIRCUIT ANNEALING METHODS AND APPARATUS

TECHNICAL FIELD

The subject matter relates generally to the field of semiconductors and, more particularly, to improved methods and apparatus for thermal annealing of integrated circuits.

BACKGROUND INFORMATION

During the fabrication of integrated circuits (ICs), IC's typically undergo a heat treating or thermal annealing process following implantation or doping of the wafer, prior to segmentation of the wafer into individual dice. Annealing helps to repair the silicon lattice structure following doping, and it also functions to activate the dopant. Annealing is generally performed within a temperature range of 600–1400 degrees Centigrade.

In the field of semiconductor electronics there is an incessant competitive pressure among manufacturers to improve the quality of their products while driving down production costs. This is particularly true regarding the annealing of ICs. ICs must be annealed in a carefully controlled manner that sufficiently heats them without overheating them. Furthermore, the annealing process should preferably be performed quickly and in an energy-efficient manner.

It is known to employ a rapid thermal annealing (RTA) process that raises the temperature of the entire silicon wafer for a few seconds using, for example, heat lamps radiating the doped wafer surface while providing cooling to the wafer back side. However, the RTA process can be difficult to control, because the lamp turn-on times are variable, as are the back side cooling rates.

It is also known to employ pulsed or stepped laser annealing, in which a pulsed laser beam is directed sequentially at each die. The laser beam is turned on very briefly, e.g. for 20 nanoseconds (ns), and it is then turned off while the beam is stepped to the next die. However, laser annealing at 20 ns engenders a significant problem, because the thermal diffusion length in this time scale in silicon is approximately only 0.5 microns, which is comparable to the feature size on a deep sub-micron IC chip. Thus the temperature in the active area is very different from the temperature in the field area. This generally causes the polysilicon traces in the field area to melt and disintegrate during laser annealing. Although the use of a protective film lessens this problem somewhat, such films increase production costs and can cause additional problems.

Thus the RTA process is too slow and unpredictable, and pulsed laser annealing is too fast and heats too little of the wafer. An ideal process should have a process time in the range of 1 microsecond to 1 millisecond, and it should have a thermal diffusion length of 5–100 microns.

It is known to use a pulsed laser having a longer pulse width, but this approach has two problems. First, the laser energy stability is poor, being normally worse than 3%. Secondly, the annealing throughput is low, because the laser has to step through each die on the silicon wafer.

For the reasons stated above, and for other reasons stated below which will become apparent to those skilled in the art upon reading and understanding the present specification, there is a significant need in the art for a thermal annealing process that provides effective annealing at a relatively high throughput rate.

DETAILED DESCRIPTION

In the following detailed description of embodiments of the invention, reference is made to the accompanying drawings which form a part hereof, and in which is shown by way of illustration specific preferred embodiments in which the subject matter may be practiced. These embodiments are described in sufficient detail to enable those skilled in the art to practice the subject matter, and it is to be understood that other embodiments may be utilized and that logical, procedural, mechanical, and electrical changes may be made without departing from the spirit and scope of the subject matter. The following detailed description is, therefore, not to be taken in a limiting sense, and the scope of the subject matter is defined only by the appended claims.

The subject matter provides a solution to the problem of annealing processes that are slow, uncontrolled, and/or ineffective. Various embodiments are illustrated and described herein. In one embodiment, an annealing method moves a continuous laser beam having a spot size comparable to the die size in a back-and-forth pattern over every die on the wafer surface without stopping. Methods and apparatus utilizing other scanning patterns are also disclosed. Also, methods and apparatus to anneal an object comprising a plurality of regions are disclosed. In addition, an annealing system, computer-based methods for annealing, and a computer-readable medium comprising computer instructions for annealing are also described. The improved annealing techniques are effective and controllable, and they can significantly increase annealing throughput while concurrently supporting a high quality annealing process.

Figure 1:
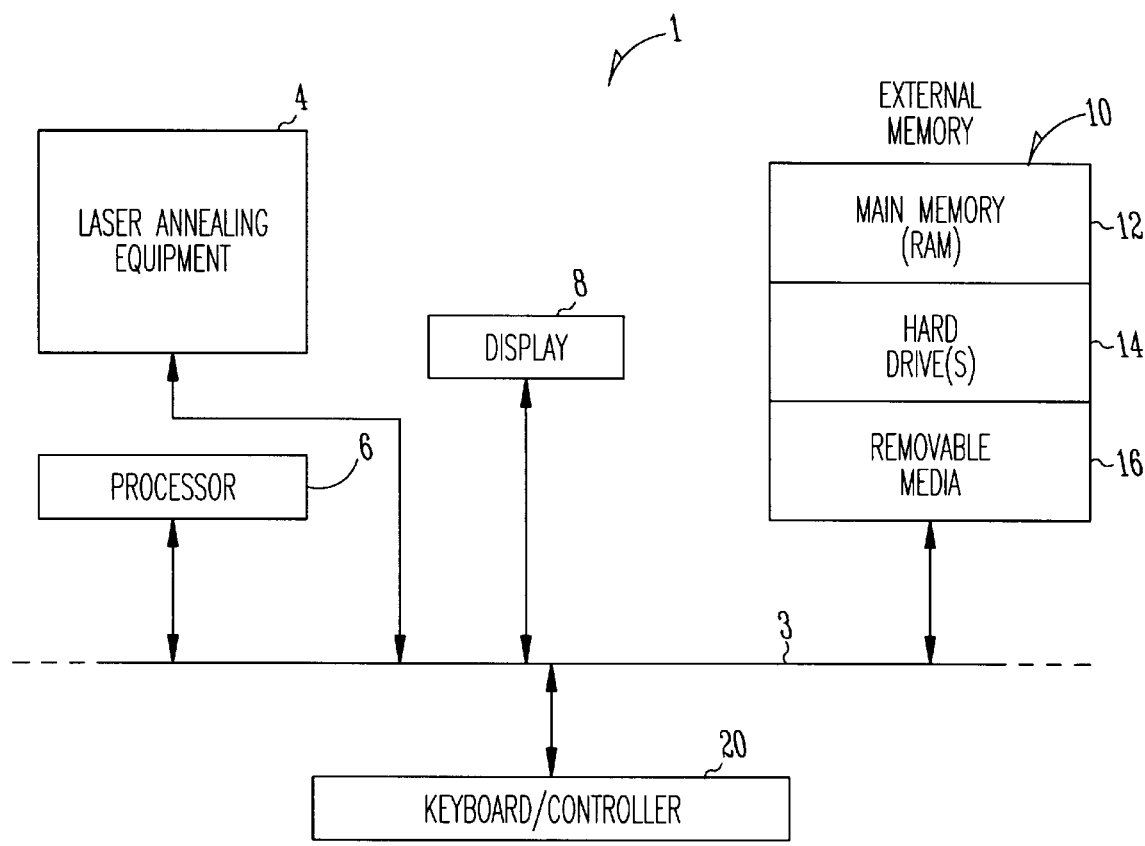
FIG. 1 illustrates a block diagram of a computer-controlled laser annealing system, in accordance with one embodiment of the invention.

FIG. 1 illustrates a block diagram of a computer-controlled laser annealing system 1, in accordance with one embodiment of the invention. Laser annealing system 1 is merely one example of a system in which the subject matter can be used. In this example, laser annealing system 1 includes laser annealing equipment 4 (shown in greater detail in FIG. 2). Laser annealing system comprises at least one processor 6. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), an application-specific integrated circuit (ASIC), a communication circuit, an artificial intelligence circuit, neural network, or any other type of circuit for performing processing functions of any type, or a combination of such computational circuits.

Laser annealing system 1 further comprises a system bus 3 to couple the various components of the system. System bus 3 provides communications links among the various components of the laser annealing system 1 and can be implemented as a single bus, as a combination of busses, or in any other suitable manner.

Laser annealing system 1 can also include an external memory 10, which in turn can include one or more memory elements, such as a main memory 12 in the form of random access memory (RAM), one or more hard drives 14, and/or one or more drives that handle removable media 16 such as floppy diskettes, compact disks (CDs), tape drives, and the like.

Laser annealing system 1 can also include a display device 8 and a keyboard and/or controller 20, which can include a mouse, trackball, voice-recognition device, or any other device that permits a system user to input information into and receive information from the laser annealing system 1.

Figure 2:
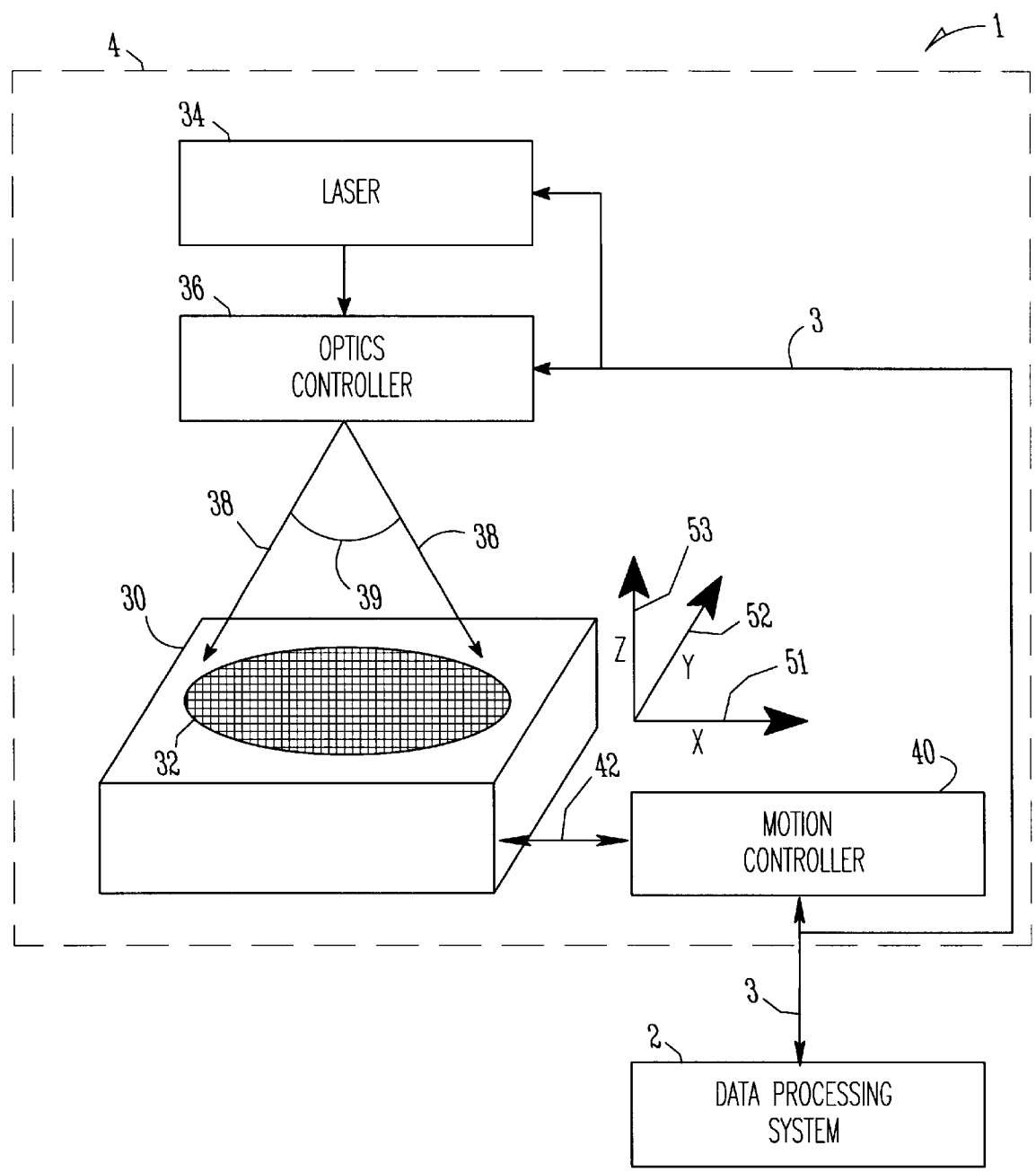
FIG. 2 illustrates a more detailed block diagram of laser annealing equipment of a computer-controlled laser annealing system, in accordance with one embodiment of the invention.

FIG. 2 illustrates a more detailed block diagram of the laser annealing equipment 4 of computer-controlled laser annealing system 1, in accordance with one embodiment of the invention. Data processing system 2 can comprise processor 6, display 8, external memory 10, and keyboard/controller 20 shown in FIG. 1.

Laser annealing equipment 4 (shown inside dashed rectangle 4) comprises wafer support platform or stage 30 on which a wafer 32 is secured. Wafer stage 30 is coupled to motion controller 40 via bus 42. Motion controller 40 is coupled to system bus 3 of data processing system 2.

Motion controller 40 can be integrated into wafer stage 30 if desired. Motion controller 40 is controlled by suitable instructions in a computer program that is stored in and executed by data processing system 2. Motion controller 40 causes a reference point (not shown) of wafer 32 on wafer stage 30 to move to any desired location in a three-dimensional Cartesian coordinate system, as represented for example by X-axis 51, Y-axis 52, and Z-axis 53. Alternatively, a polar coordinate system, or any other type of coordinate system, could be used. In another embodiment, a two-dimensional coordinate system could be used, in which a reference point on wafer 32 is moved in the X and/or Y directions. In yet another embodiment, a linear coordinate system could be used, in which a reference point on wafer 32 is moved only along the X-axis 51 or only along the Y-axis 52.

Laser annealing equipment 4 further comprises a laser 34 generating an optical beam at a particular frequency in the electromagnetic spectrum and having suitable optical power to provide intense localized heating. Laser annealing equipment 4 also comprises optics controller 36, which is functionally coupled to laser 34. Optics controller 36 performs various functions upon the laser beam 38 generated by laser 34, including shaping the laser beam 38, controlling the intensity of laser beam 38, and moving laser beam 38 in the X-Y plane within arc 39 so that laser beam 38 can contact any point on the exposed upper surface of wafer 32.

Laser 34 and optics controller 36 are coupled to system bus 3 of data processing system 2. Laser 34 and optics controller 36 are controlled by suitable instructions in a computer program that is stored in and executed by data processing system 2. One of ordinary skill in the art is capable of writing suitable instructions to control the relative movement between a laser beam 38 generated by laser 34 and an object (such as wafer 32) being scanned by the laser beam. As discussed below, the relative movement can be accomplished by movement of the laser beam 38, movement of the object (such as wafer 32), or a combination of movement of the laser beam 38 and movement of the object.

Figure 3:
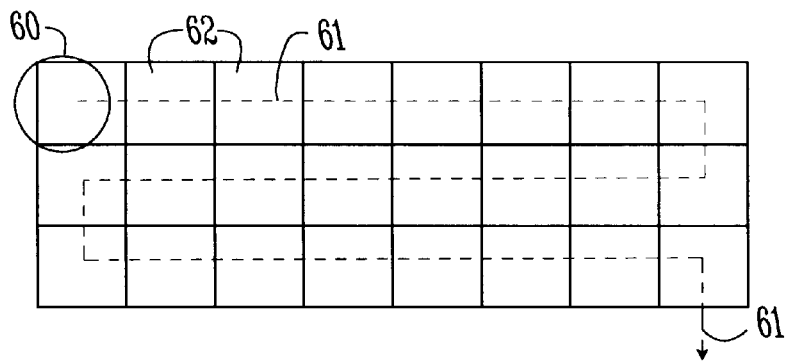
FIG. 3 illustrates a continuous, back-and-forth laser scan path of a computer-controlled laser annealing system in which the spot size of the laser beam is substantially equivalent to the size of the dice, in accordance with one embodiment of the invention.

FIG. 3 illustrates a continuous, back-and-forth laser scan path 61 of a computer-controlled laser annealing system in which the spot size of the laser beam 60 is substantially equivalent to the size (more specifically, to the width, which is the top-to-bottom dimension of a die 62, as viewed in FIG. 3) of the dice 62, in accordance with one embodiment of the invention. In FIG. 3 a portion of a wafer is shown comprising a plurality of dice, including dice 62. Laser beam 60 is controlled by optics controller 36 (FIG. 2) to move continuously along scan path 61 in the following pattern:

(1) Move laser beam 60 across the wafer while annealing each die in the row, using a continuous, non-interrupted beam.

(2) Increment laser beam 60 to the next row.

(3) Move laser beam 60 back across the wafer while annealing each die in the row, using a continuous, non-interrupted beam.

(4) Increment laser beam 60 to the next row.

(5) Repeat (1) to (4) until the entire wafer has been scanned.

In this embodiment, laser beam 60 moves continuously along one row of dice 62 to the end, increments to the next row of dice 62 and moves continuously in the opposite direction to the end, increments to the next row of dice 62 and again reverses direction, and so forth. This is sometimes referred to a "boustrophedon" pattern, so named because it resembles a typical pattern with which agricultural fields were plowed in ancient Greece. In this embodiment, laser beam 60 could be turned off at the end of each row until laser beam 60 has incremented to the next row.

In an alternative embodiment, scan path 61 can be implemented through coordinated movements of laser beam 60 and wafer 32 on wafer stage 30 (FIG. 2). In this embodiment, laser beam 60 is controlled by optics controller 36 (FIG. 2), and wafer 32 (FIG. 2) is controlled by motion controller 40 (FIG. 2), in the following pattern:

(1) Move laser beam 60 over the wafer while annealing each die in the row, using a continuous, non-interrupted beam.

(2) Move wafer 32 (FIG. 2) to the next row.

(3) Move laser beam 60 back across the wafer while annealing each die in the row, using a continuous, non-interrupted beam.

(4) Move wafer 32 (FIG. 2) to the next row.

(5) Repeat (1) to (4) until the entire wafer has been scanned.

In this embodiment, laser beam 60 could be turned off at the end of each row until the wafer has incremented to the next row.

In yet another embodiment, scan path 61 can be implemented solely through movement of wafer 32 on wafer stage 30 (FIG. 2). In this embodiment, laser beam 60 is pointed at a fixed reference point with respect to wafer stage 30 and is not moved, and wafer 32 (FIG. 2) is controlled by motion controller 40 (FIG. 2), in the following pattern:

(1) Move wafer 32 (FIG. 2) to the left while annealing each die in the row, using a continuous, non-interrupted beam.

(2) Move wafer 32 (FIG. 2) to the next row.

(3) Move wafer 32 (FIG. 2) to the right while annealing each die in the row, using a continuous, non-interrupted beam.

(4) Move wafer 32 (FIG. 2) to the next row.

(5) Repeat (1) to (4) until the entire wafer has been scanned.

In this embodiment, laser beam 60 could be turned off at the end of each row until the wafer has incremented to the next row. Whether implemented by moving only laser beam 60, by a combination of movements of laser beam 60 and wafer 32 (FIG. 3), or by moving only wafer 32 (FIG. 2), the scan path 61 is substantially the same. The scan path 61 is continuous in each of these embodiments, although laser beam 60 could optionally be turned off between row scans of wafer 32.

Figure 4:
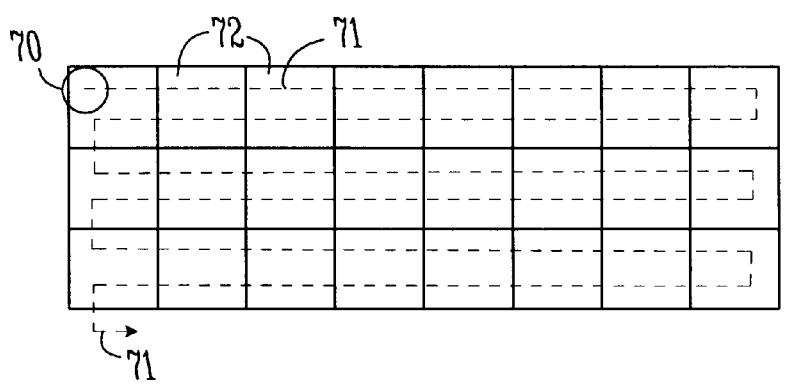
FIG. 4 illustrates a continuous, back-and-forth laser scan path of a computer-controlled laser annealing system in which the spot size of the laser beam is approximately one-half the size of the dice, in accordance with one embodiment of the invention.

FIG. 4 illustrates a continuous, back-and-forth laser scan path 71 of a computer-controlled laser annealing system in which the spot size of the laser beam 70 is approximately one-half the size of the dice 72, in accordance with one embodiment of the invention.

Laser beam 70 is controlled by optics controller 36 (FIG. 2) to move continuously along scan path 71 in the following pattern:

(1) Move laser beam 70 across the wafer while annealing the top half of each die in the row, using a continuous, non-interrupted beam.

(2) Increment laser beam 70 to the bottom half of the row.

(3) Move laser beam 60 back across the wafer while annealing the bottom half of each die in the row, using a continuous, non-interrupted beam.

(4) Increment laser beam 60 to the top half of the next row.

(5) Repeat (1) to (4) until the entire wafer has been scanned.

This embodiment can be used, for example, if relatively more power per unit area is required, such as for a large die size, or for a low output laser beam.

Also, similar to the alternative embodiments discussed in FIG. 3, scan path 71 can be implemented by moving only wafer 32, or by coordinated movements of laser beam 70 and wafer 32 on wafer stage 30 (FIG. 2).

Figure 5:
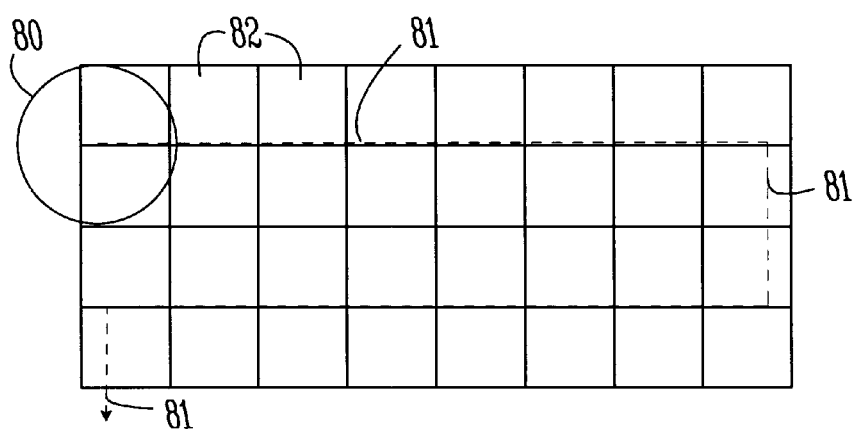
FIG. 5 illustrates a continuous, back-and-forth laser scan path of a computer-controlled laser annealing system in which the spot size of the laser beam is approximately twice the size of the dice, in accordance with one embodiment of the invention.

FIG. 5 illustrates a continuous, back-and-forth laser scan path 81 of a computer-controlled laser annealing system in which the spot size of the laser beam 80 is approximately twice the size of the dice 82, in accordance with one embodiment of the invention.

Laser beam 80 is controlled by optics controller 36 (FIG. 2) to move continuously along scan path 81 in the following pattern:

(1) Move laser beam 80 across the wafer while annealing the top two rows of dice in the row, using a continuous, non-interrupted beam.

(2) Increment laser beam 80 to the next two rows of dice.

(3) Move laser beam 80 back across the wafer while annealing these two rows of dice in the row, using a continuous, non-interrupted beam.

(4) Increment laser beam 80 to the next two rows of dice.

(5) Repeat (1) to (4) until the entire wafer has been scanned.

This embodiment can be used, for example, if relatively less power per unit area is required, such as for a small die size, or for a high output laser beam. Multiples other than two could also be used, including non-integer and fractional multiples.

Also, similar to the alternative embodiment discussed in FIG. 3, scan path 81 can be implemented by moving only wafer 32, or by coordinated movements of laser beam 80 and wafer 32 on wafer stage 30 (FIG. 2).

Figure 6:
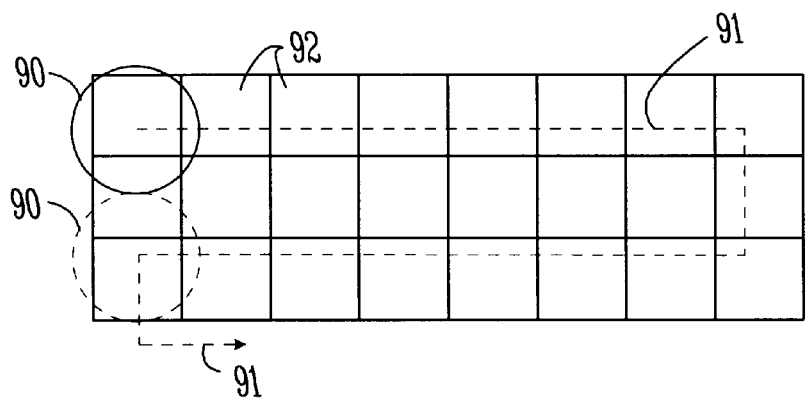
FIG. 6 illustrates a continuous, back-and-forth laser scan path of a computer-controlled laser annealing system in which the spot size of the laser beam is approximately 1.5 the size of the dice, in accordance with one embodiment of the invention.

FIG. 6 illustrates a continuous, back-and-forth laser scan path 91 of a computer-controlled laser annealing system in which the spot size of the laser beam 90 is approximately 1.5 the size of the dice 92, in accordance with one embodiment of the invention.

Laser beam 90 is controlled by optics controller 36 (FIG. 2) to move continuously along scan path 91 in the following pattern:

(1) Move laser beam 90 across the wafer while annealing the top row and the upper half of the second row of dice, using a continuous, non-interrupted beam.

(2) Increment laser beam 90 by 1.5 rows.

(3) Move laser beam 90 back across the wafer while annealing the bottom half of the second row and all of the third row, using a continuous, non-interrupted beam.

(4) Increment laser beam 90 by 1.5 rows.

(5) Repeat (1) to (4) until the entire wafer has been scanned.

This embodiment is similar to the embodiment shown in FIG. 5, but it provides slightly greater power per unit area.

This embodiment can be used, for example, if relatively less power per unit area is required (compared to that produced by the embodiment shown in FIG. 3), such as for a small die size, or for a high output laser beam.

Also, similar to the alternative embodiment discussed in FIG. 3, scan path 91 can be implemented by moving only wafer 32, or through coordinated movements of laser beam 90 and wafer 32 on wafer stage 30 (FIG. 2).

Figure 7:
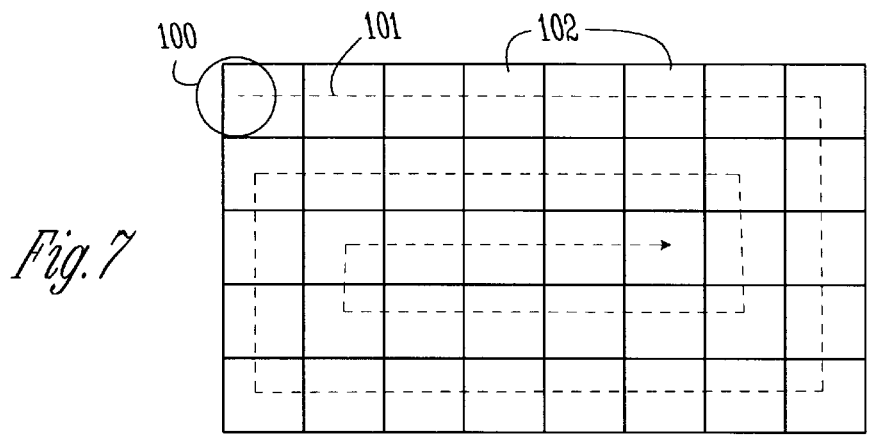
FIG. 7 illustrates a continuous, spiral laser scan path of a computer-controlled laser annealing system in which the spot size of the laser beam is substantially equivalent to the size of the dice, in accordance with one embodiment of the invention.

FIG. 7 illustrates a continuous, spiral laser scan path 101 of a computer-controlled laser annealing system in which the spot size of the laser beam 100 is substantially equivalent to the size of the dice 102, in accordance with one embodiment of the invention.

Laser beam 100 is controlled by optics controller 36 (FIG. 2) to move continuously along scan path 101 in the following pattern;

(1) Move laser beam 100 across the wafer while annealing the top row of dice, using a continuous, non-interrupted beam.
(2) Move laser beam 100 down the right-most column of dice, using a continuous, non-interrupted beam.
(3) Move laser beam 100 back across the wafer while annealing the bottom row of dice, using a continuous, non-interrupted beam.
(4) Move laser beam 100 up the left-most column of dice, using a continuous, non-interrupted beam, until the beam reaches the row of dice below the row previously scanned.
(5) Move laser beam 100 across the wafer while annealing this row of dice, using a continuous, non-interrupted beam, until the beam reaches the column before the column of dice previously scanned downwardly.
(6) Repeat similar operations until the entire wafer has been scanned.

Similar to the alternative embodiment discussed in FIG. 3, scan path 101 can be implemented by moving only wafer 32, or through coordinated movements of laser beam 100 and wafer 32 on wafer stage 30 (FIG. 2). Also, the width of scan path 101 could be wider or narrower than the die size.

Figure 8:
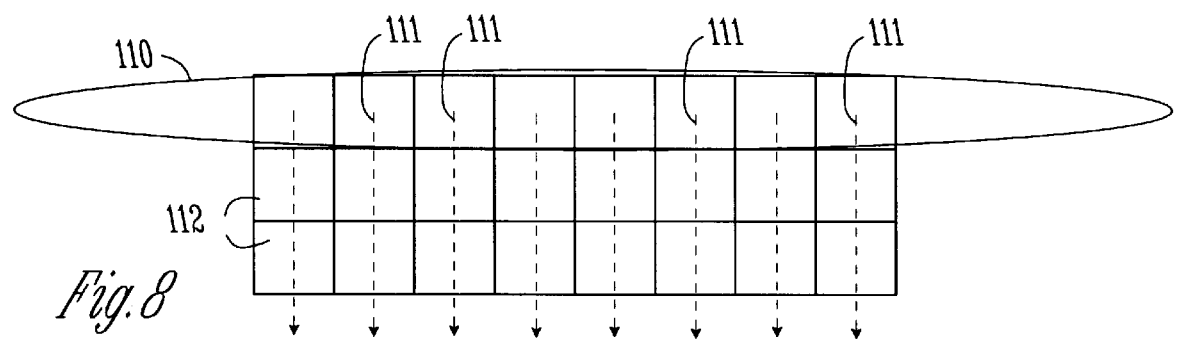
FIG. 8 illustrates a continuous, sweeping laser scan path of a computer-controlled laser annealing system in which the laser beam is formed into a strip having a width substantially equivalent to the die dimension and a length substantially equivalent to the wafer dimension, in accordance with one embodiment of the invention.

FIG. 8 illustrates a continuous, sweeping laser scan path 111 of a computer-controlled laser annealing system in which the laser beam is formed into a strip 110 having a width substantially equivalent to the die dimension and a length substantially equivalent to the wafer dimension, in accordance with one embodiment of the invention.

In this embodiment, optics controller 36 (FIG. 2) shapes laser beam into a strip 110 whose width is comparable to the width of die 112, and whose length is comparable to the width of wafer 32 (FIG. 2).

In another embodiment, the length of laser strip 110 could be different from the width of wafer 32 (FIG. 2). That is, it could be longer or shorter than the width of wafer 32 (FIG. 2).

Laser strip 110 is controlled by optics controller 36 (FIG. 2) to move continuously along scan path 111 in the following pattern:

(1) Position the laser strip 110 over the top row of the wafer.
(2) Turn the laser strip 110 on, and move laser strip 110 down the wafer while concurrently annealing all dice in each row, using a continuous, non-interrupted beam.
(3) Turn the laser strip 110 off when it has annealed the bottom row of dice of the wafer.
(4) Repeat (1) to (3) for each wafer.

Alternatively, laser strip 110 could be controlled to scan along scan path 111 without being turned on and off, for example, by positioning laser strip 110 off the wafer when it is not annealing dice.

Similar to the alternative embodiment discussed in FIG. 3, scan path 111 can be implemented by moving only wafer 32, or through coordinated movements of laser strip 110 and wafer 32 on wafer stage 30 (FIG. 2).

Figure 9:
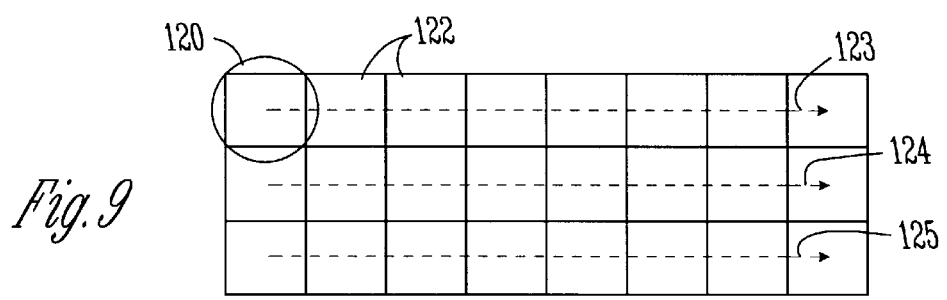
FIG. 9 illustrates a partially continuous series of left-to-right laser scan paths of a computer-controlled laser annealing system in which the spot size of the laser beam is substantially equivalent to the size of the dice, in accordance with one embodiment of the invention.

FIG. 9 illustrates a partially continuous series of left-to-right laser scan paths 123–125 of a computer-controlled laser annealing system in which the spot size of the laser beam 120 is substantially equivalent to the size of the dice 122, in accordance with one embodiment of the invention.

Laser beam 120 is controlled by optics controller 36 (FIG. 2) to move sequentially over continuous paths 123, 124, and 125 in the following pattern:

(1) Starting at the left-hand side of the first row, move laser beam 120 across the wafer while annealing each die in the first row, using a continuous, non-interrupted beam.
(2) Move laser beam 120 to the left-hand side of the second row. Laser beam 120 can be turned off during the fly-back phase, or it could be left on if it can be moved fast enough without overly heating the die in its fly-back path.
(3) Starting at the left-hand side of the second row, move laser beam 120 across the wafer while annealing each die in the second row, using a continuous, non-interrupted beam.
(4) Move laser beam 120 to the left-hand side of the third row.
(5) Repeat similar operations until the entire wafer has been scanned.

Similar to the alternative embodiment discussed in FIG. 3, scan paths 123–125 can be implemented by moving only wafer 32, or through coordinated movements of laser beam 100 and wafer 32 on wafer stage 30 (FIG. 2).

Also, similar to the embodiments shown in FIGS. 4–6, scan paths 123–125 could have a width that is less than or greater than the die width, and the number of rows or fractional rows scanned in each pass could be adjusted accordingly.

Figure 10:
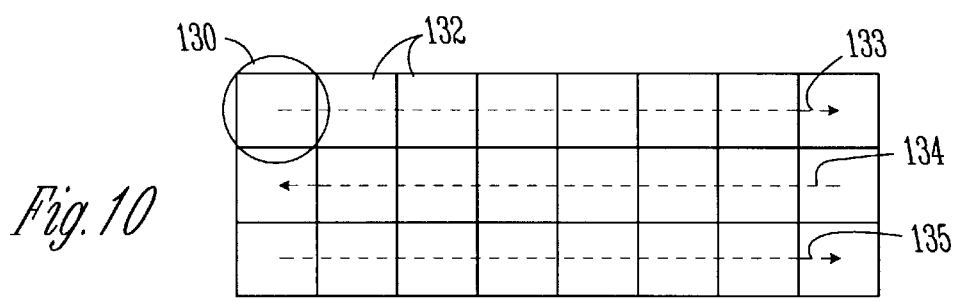
FIG. 10 illustrates a partially continuous series of back-and-forth laser scan paths of a computer-controlled laser annealing system in which the spot size of the laser beam is substantially equivalent to the size of the dice, in accordance with one embodiment of the invention.

FIG. 10 illustrates a partially continuous series of back-and-forth laser scan paths 133–135 of a computer-controlled laser annealing system in which the spot size of the laser beam 130 is substantially equivalent to the size of the dice 132, in accordance with one embodiment of the invention. This embodiment is similar to that shown in FIG. 3; however, in this embodiment laser beam 130 is turned off at the end of each row of dice while laser beam 130 is incremented to the next row (either by moving laser beam 130, the wafer, or both).

Laser beam 130 is controlled by optics controller 36 (FIG. 2) to move sequentially over continuous paths 133, 134, and 135 in the following pattern:

(1) Starting at the left-hand side of the first row, turn on laser beam 130, and move laser beam 130 across the wafer while annealing each die in the first row, using a continuous, non-interrupted beam.
(2) Turn off laser beam 130 and increment laser beam 130 to the next row of dice.
(3) Turn on laser beam 130, and move laser beam 130 to the left-hand side of the second row while annealing each die in the second row, using a continuous, non-interrupted beam.
(4) Repeat similar operations until the entire wafer has been scanned.

Scan paths 133–135 are partially continuous, because they are continuous along each row of dice, and they are only turned off at the end of each row.

Similar to the alternative embodiment discussed in FIG. 3, scan paths 133–135 can be implemented by moving only wafer 32, or through coordinated movements of laser beam 100 and wafer 32 on wafer stage 30 (FIG. 2).

Also, similar to the embodiments shown in FIGS. 4–6, scan paths 133–135 could have a width that is less than or greater than the die width, and the number of rows or fractional rows scanned in each pass could be adjusted accordingly.

Figure 11:
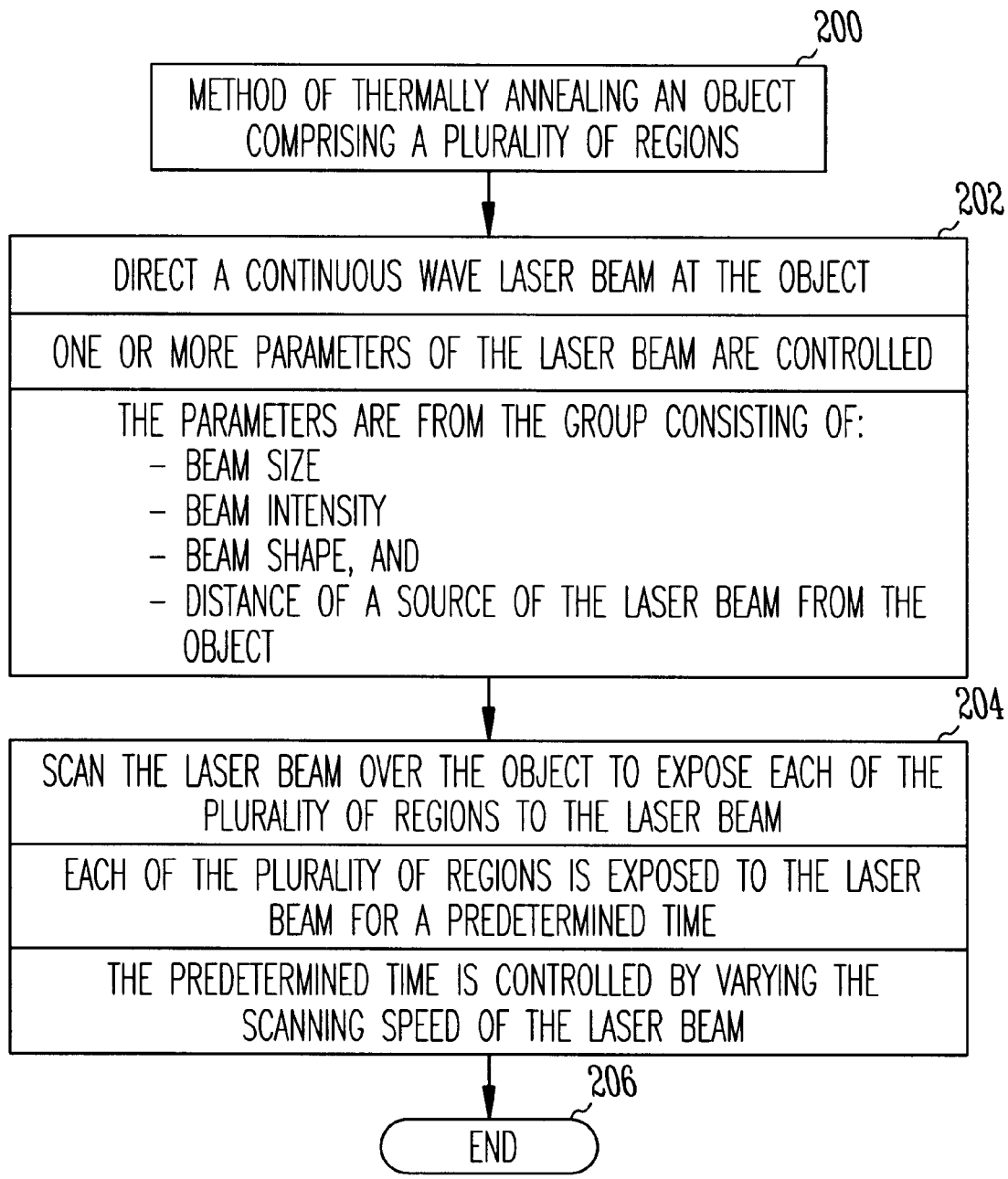
FIG. 11 illustrates a flow diagram of a method of thermally annealing an object comprising a plurality of regions, in accordance with one embodiment of the invention.

FIG. 11 illustrates a flow diagram of a method 200 of thermally annealing an object comprising a plurality of regions, in accordance with one embodiment of the invention. The subject matter should not be construed as being limited to annealing ICs, but rather it can be used for heat treating any object. It is particularly suited for annealing objects that comprise a plurality of regions. The regions generally are of similar size, but they are not required to be of similar size.

In certain embodiments discussed and/or illustrated herein, in which an object being annealed is a semiconductor wafer, a region may be equivalent to an IC on the wafer. A region can also be larger or smaller in size than an IC.

In 202, a continuous wave laser beam is directed at the object. One or more parameters of the laser beam are controlled. These parameters are from a group that includes beam size, beam intensity, beam shape, and the distance of a source of the laser beam from the object.

In 204, the laser beam is scanned over the object to expose each of the plurality of regions to the laser beam. Each of the plurality of regions is exposed to the laser beam for a predetermined time. The predetermined time can be controlled by varying the scanning speed of the laser beam. The process ends at 206.

Figure 12:
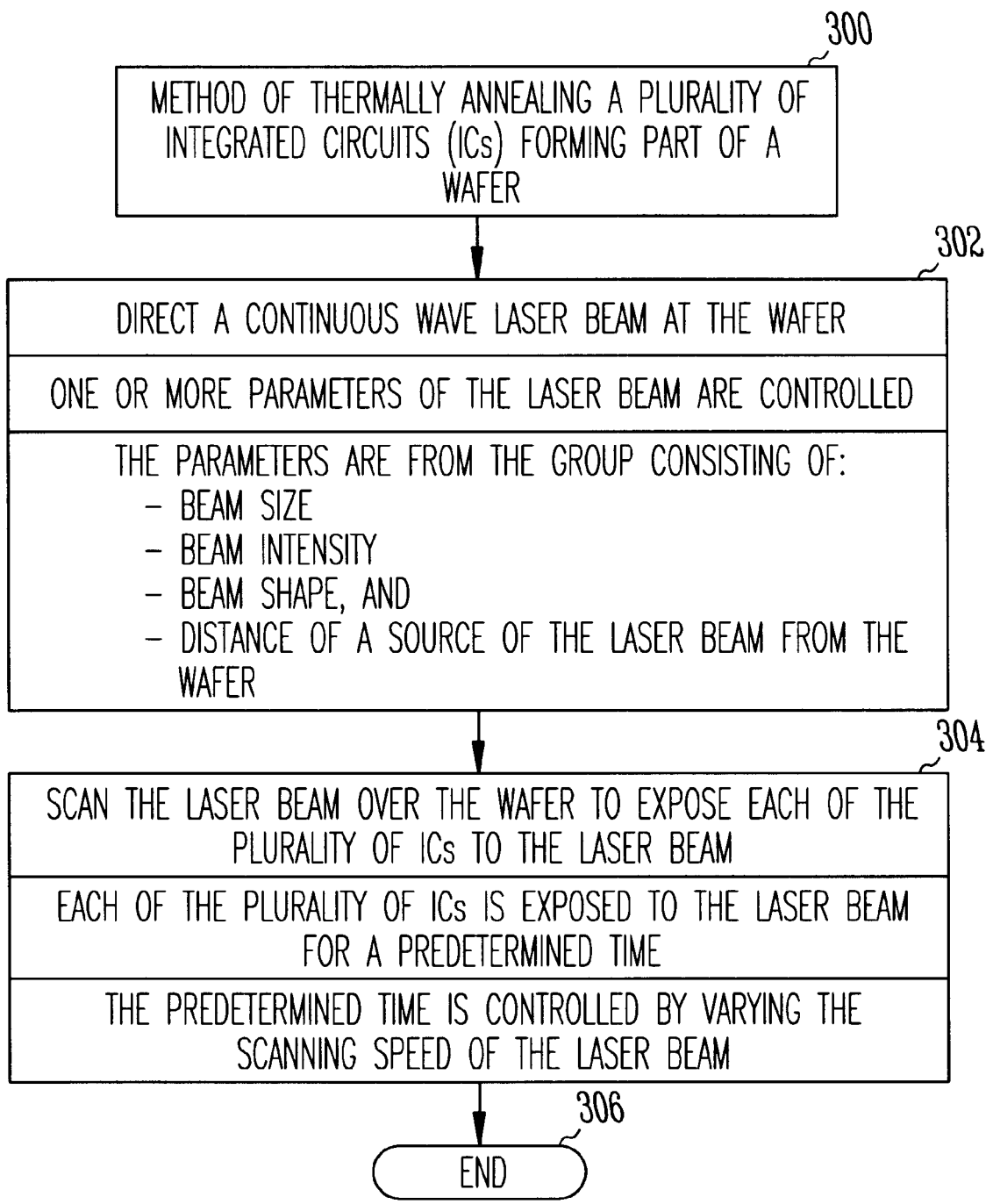
FIG. 12 illustrates a flow diagram of a method of thermally annealing a plurality of ICs forming part of a wafer, in accordance with one embodiment of the invention.

FIG. 12 illustrates a flow diagram of a method 300 of thermally annealing a plurality of ICs forming part of a wafer, in accordance with one embodiment of the invention.

In 302, a continuous wave laser beam is directed at the wafer. One or more parameters of the laser beam are controlled. These parameters are from a group that includes beam size, beam intensity, beam shape, and the distance of a source of the laser beam from the wafer.

In 304, the laser beam is scanned over the wafer to expose each of the plurality of ICs to the laser beam. Each of the plurality of ICs is exposed to the laser beam for a predetermined time. The predetermined time can be controlled by varying the scanning speed of the laser beam. The process ends at 306.

Figure 13:
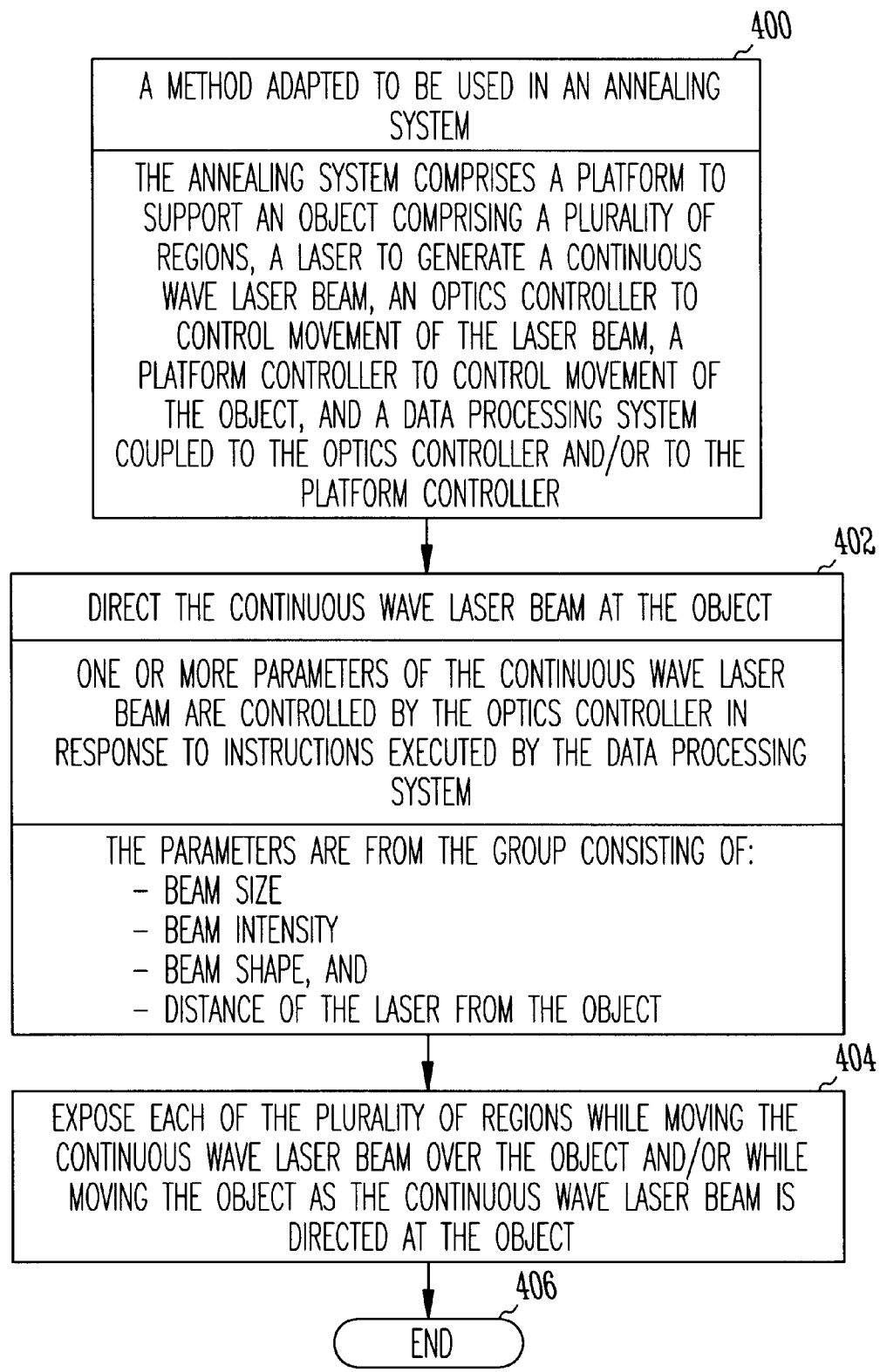
FIG. 13 illustrates a flow diagram of a method to be used in an annealing system, in accordance with one embodiment of the invention.

FIG. 13 illustrates a flow diagram of a method 400 to be used in an annealing system, in accordance with one embodiment of the invention. The annealing system comprises, in one embodiment, a platform to support an object comprising a plurality of regions, a laser to generate a continuous wave laser beam, an optics controller to control movement of the laser beam, a platform controller to control movement of the object, and a data processing system coupled to the optics controller and/or to the platform controller.

In 402, the continuous wave laser beam is directed at the object. One or more parameters of the laser beam are controlled by the optics controller in response to instructions executed by the data processing system. These parameters are from a group that includes beam size, beam intensity, beam shape, and the distance of a source of the laser beam from the object.

In 404, each of the plurality of regions is exposed while moving the continuous wave laser beam in the X-Y plane over the object and/or while moving the object in the X-Y plane as the continuous wave laser beam is directed at the object. The process ends at 406.

Figure 14:
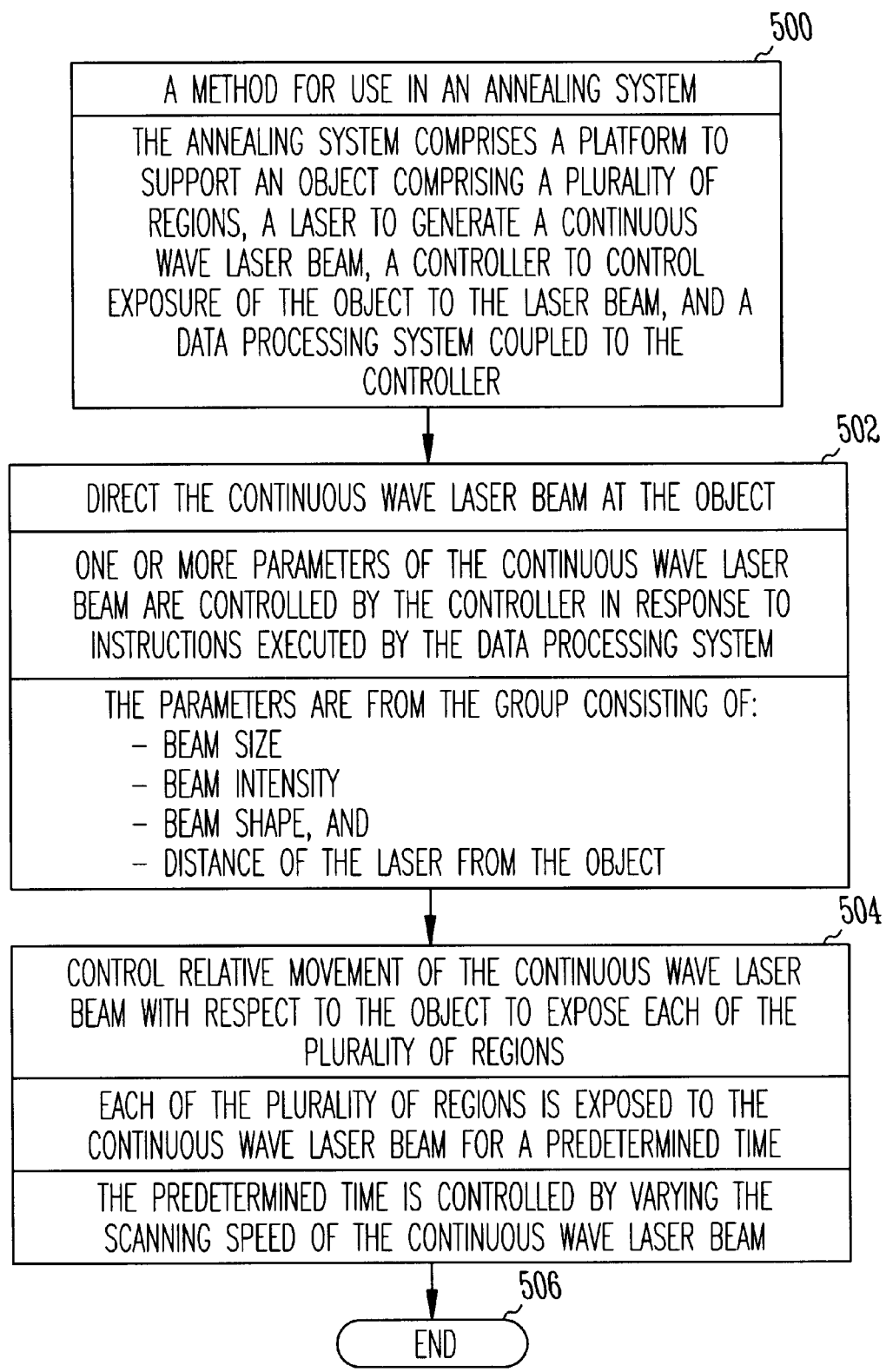
FIG. 14 illustrates a flow diagram of a method for use in an annealing system, in accordance with one embodiment of the invention.

FIG. 14 illustrates a flow diagram of a method 500 for use in an annealing system, in accordance with one embodiment of the invention. The annealing system comprises, in one embodiment, a platform to support an object comprising a plurality of regions, a laser to generate a continuous wave laser beam, a controller to control the exposure of the object to the laser beam, and a data processing system coupled to the controller.

In 502, the continuous wave laser beam is directed at the object. One or more parameters of the laser beam are controlled by the controller in response to instructions executed by the data processing system. These parameters are from a group that includes beam size, beam intensity, beam shape, and the distance of a source of the laser beam from the object.

In 504, relative movement of the continuous wave laser beam is controlled with respect to the object to expose each of the plurality of regions. Each of the plurality of regions is exposed to the continuous wave laser beam for a predetermined time. The predetermined time is controlled by varying the scanning speed of the continuous wave laser beam. The process ends at 506.

Figure 15:
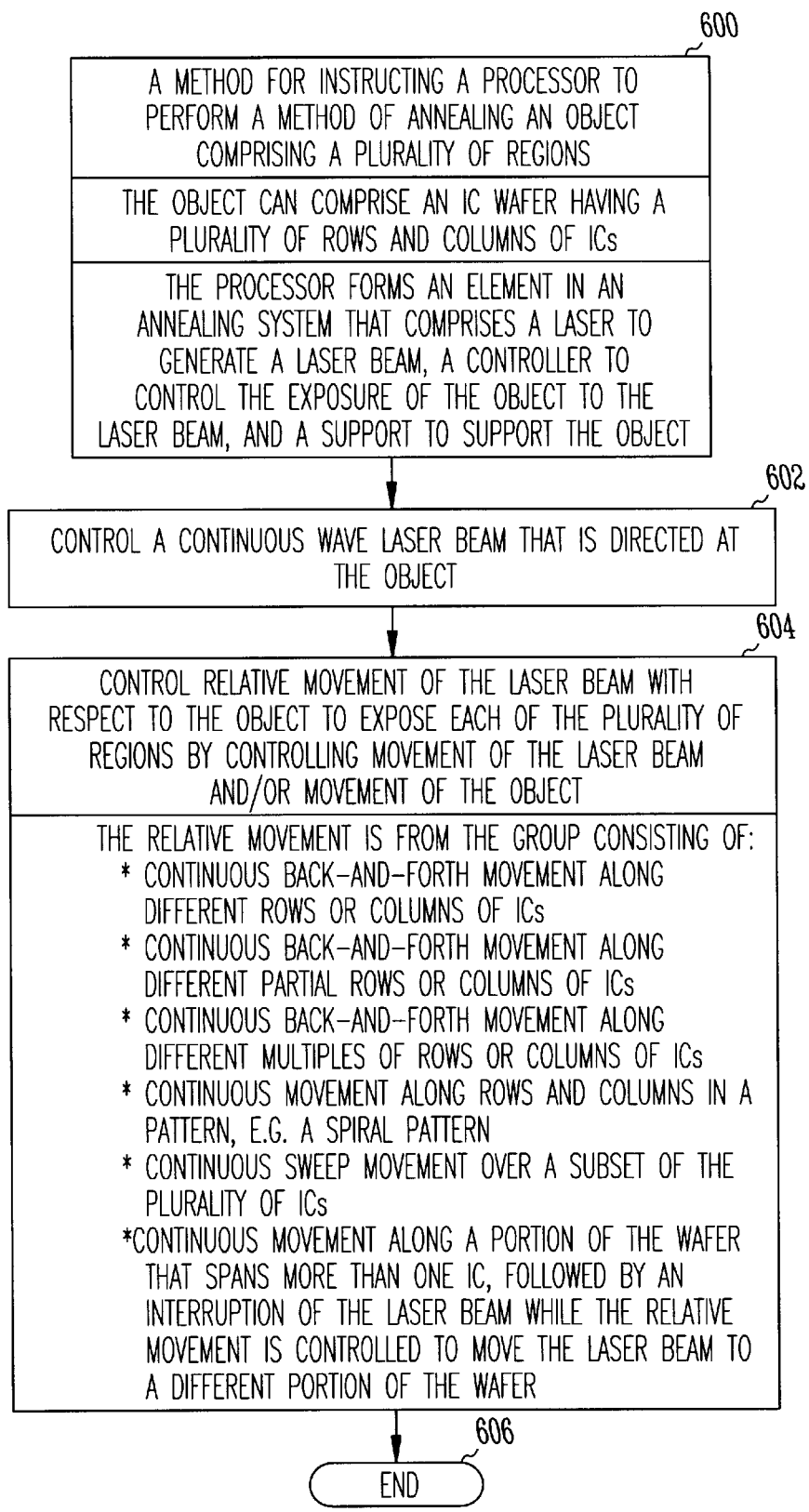
FIG. 15 illustrates a flow diagram of a method for instructing a processor to perform a method of annealing an object comprising a plurality of regions, in accordance with one embodiment of the invention.

FIG. 15 illustrates a flow diagram of a method 600 for instructing a processor to perform a method of annealing an object comprising a plurality of regions, in accordance with one embodiment of the invention. The object can comprise, for example, an IC wafer having a plurality of rows and columns of ICs. The processor forms an element in an annealing system that comprises a laser to generate a laser beam, a controller to control the exposure of the object to the laser beam, and a support to support the object.

In 602, a continuous wave laser beam that is directed at the object is controlled. The beam can be controlled, for example, in any of the ways mentioned earlier.

In 604, relative movement of the laser beam with respect to the object is controlled to expose each of the plurality of regions. This can be done by controlling movement of the laser beam in the X-Y plane and/or movement of the object in the X-Y plane. The relative movement can be of any suitable type. For example, the relative movement can comprise any one or more of the following patterns:

Continuous back-and-forth movement along different rows or columns of ICs. One implementation of this pattern is illustrated in FIG. 3.

Continuous back-and-forth movement along different partial rows or columns of ICs. One implementation of this pattern is illustrated in FIG. 4.

Continuous back-and-forth movement along different multiples of rows or columns of ICs. Different implementations of this pattern are illustrated in FIGS. 5 and 6.

Continuous movement along rows and columns in a pattern, such as a spiral pattern. One implementation of this pattern is illustrated in FIG. 7. Other patterns that comprise switching between ICs in different rows and columns are also possible, such as a back-and-forth scan beginning in (for example) the upper left-hand corner of a wafer and moving along diagonals (rather than along rows or columns) to the lower right-hand corner of the wafer.

Continuous sweep movement over a subset of the plurality of ICs. One implementation of this pattern is illustrated in FIG. 8.

Continuous movement along a portion of the wafer that spans more than one IC, followed by an interruption of the laser beam (e.g. blocking the laser beam) while the relative movement is controlled to move the laser beam to a different portion of the wafer. Different implementations of this pattern are illustrated in FIGS. 9 and 10.

It should be understood that the scanning patterns shown in FIGS. 3–10 are merely representative and not exclusive, and that many other different scanning patterns could be implemented using the concepts taught by the subject matter.

The operations described above with respect to the methods illustrated in FIGS. 11–15 can be performed in a different order from those described herein. Also, it will be understood that although the methods are described as having an "end", they typically are continuously performed.

CONCLUSION

The subject matter provides for improved methods for thermally annealing objects, such as semiconductor wafers on which ICs have been fabricated. Because a continuously scanning laser beam is used, the annealing process can be carefully controlled, e.g. by varying the scanning speed, the beam intensity, and/or the beam shape and size, to provide annealing of ICs at greater throughput and with higher quality than utilizing conventional annealing methods. Laser annealing is faster, cleaner, and more energy efficient than many other types of annealing techniques, such as heat lamps and ovens. Because energy costs are beginning to assume an increasingly higher proportion of production costs, laser annealing can help to control such costs. As a result, IC products can be manufactured at lower cost and with higher quality, making them more competitive in the commercial marketplace.

Various embodiments have been disclosed, including methods of annealing, annealing systems, and a computer-readable medium comprising computer instructions to perform annealing.

Other embodiments will be readily apparent to those of ordinary skill in the art. The elements, architecture, scan patterns, and sequence of operations can all be varied to suit particular product and annealing requirements.

For example, although the subject matter has been described in the context of annealing doped ICs prior to wafer segmentation, it could be used at any other stage of IC fabrication, including but not limited to annealing of source/drain areas, annealing of silicide formations, annealing of gate dielectrics, annealing of halo-type implants, annealing of metal layers, and annealing of interlayer dielectrics.

The subject matter can be used to provide any other type of heat treatment of articles, products, components, or the like, and it is not limited to annealing ICs. For example, the subject matter could be used to provide thermal treatment of optoelectronic devices; of magnetic material used in on-chip inductors or in IC substrates; of magnetic devices, such as recording media and recording heads; or of any other items requiring heat treatment.

The various elements depicted in the drawings are merely representational and are not drawn to scale. Certain proportions thereof may be exaggerated, while others may be minimized. The drawings are intended to illustrate various implementations of the subject matter, which can be understood and appropriately carried out by those of ordinary skill in the art.

Although specific embodiments have been illustrated and described herein, it will be appreciated by those of ordinary skill in the art that any arrangement or process that is calculated to achieve the same purpose may be substituted for the specific embodiment shown. This application is intended to cover any adaptations or variations of the subject matter. Therefore, it is manifestly intended that embodiments of this invention be limited only by the claims and the equivalents thereof.

What is claimed is:

1. A method of thermally annealing a plurality of integrated circuit dice forming part of a wafer and being arranged in at least one row on the wafer, wherein each die has a width, the method comprising:
   directing a continuous wave laser beam in a single pass across the wafer to expose at least the entire width of each of the plurality of dice to the laser beam in one non-interrupted scan of the plurality of dice.

2. The method recited in claim 1, wherein in scanning, each of the plurality of dice is exposed to the laser beam for a predetermined time.

3. The method recited in claim 2, wherein the predetermined time is controlled by varying the scanning speed of the laser beam.

4. An annealing system comprising:
   a platform to support an integrated circuit wafer comprising a plurality of dice arranged in at least one row on the wafer, each die having a width;
   a laser to generate a laser beam; and
   an optics controller coupled to the laser to move the laser beam to expose at least the entire width of each of the plurality of dice to the laser beam in one non-interrupted scan of the plurality of dice.

5. The annealing system recited in claim 4 and further comprising a wafer controller to move the wafer in the X-Y plane, wherein the plurality of dice are exposed through a combination of movements of the wafer and of the laser beam.

6. The annealing system recited in claim 4, wherein the optics controller controls one or more parameters of the laser beam from the group consisting of beam size, beam intensity, beam shape, and distance of the laser from the wafer.

7. A method to be used in an annealing system comprising a platform to support an integrated circuit wafer comprising a plurality of dice arranged in at least one row on the wafer, each die having a width a laser to generate a continuous wave laser beam, an optics controller, and a data processing system coupled to the optics controller, the method operating to anneal each of the plurality of dice and comprising:
   directing the continuous wave laser beam at the wafer; and
   scanning the continuous wave laser beam in a single pass across the wafer to expose at least the entire width of each of the plurality of dice to the laser beam in one non-interrupted scan of the plurality of dice.

8. The method recited in claim 7, wherein in directing, one or more parameters of the continuous wave laser beam are controlled by the optics controller in response to instructions executed by the data processing system, the parameters being from the group consisting of beam size, beam intensity, beam shape, and distance of the laser from the wafer.

9. The method recited in claim 7, wherein the annealing system further comprises a wafer controller coupled to the data processing system to control movement of the wafer, and wherein the method further comprises: moving the wafer while directing the continuous wave laser beam at the wafer, in order to expose each of the plurality of dice.

10. A method to be used in an annealing system comprising a platform to support an integrated circuit wafer comprising a plurality of dice arranged in at least one row on the wafer, each die having a width, a laser to generate a continuous wave laser beam, a controller to control exposure of the wafer to the laser beam, and a data processing system coupled to the controller, the method operating to anneal each of the plurality of dice and comprising:

directing the continuous wave laser beam at the wafer; and controlling relative movement of the continuous wave laser beam with respect to the wafer to scan the continuous wave laser beam in a single pass across the wafer to expose at least the entire width of each of the plurality of dice to the laser beam in one non-interrupted scan of the plurality of dice.

11. The method recited in claim 10, wherein in controlling, each of the plurality of dice is exposed to the continuous wave laser beam for a predetermined time.

12. The method recited in claim 11, wherein the predetermined time is controlled by varying the scanning speed of the continuous wave laser beam.

13. The method recited in claim 12, wherein in directing, one or more parameters of the continuous wave laser beam are controlled by the controller in response to instructions executed by the data processing system, the parameters being from the group consisting of beam size, beam intensity, beam shape, and distance of the laser from the object.

14. An annealing system comprising a platform to support an integrated circuit wafer comprising a plurality of dice arranged in at least one row on the wafer, each die having a width, a laser to generate a laser beam, a controller to control exposure of the wafer to the laser beam, and a data processing system coupled to the controller, the data processing system executing a computer program, the computer program operating the annealing system to anneal each of the plurality of dice and comprising the operations of:

directing a continuous wave laser beam at the wafer; and controlling relative movement of the laser beam with respect to the wafer to scan the laser beam in a single pass across the wafer to expose at least the entire width of each of the plurality of dice to the laser beam in one non-interrupted scan of the plurality of dice.

15. The annealing system recited in claim 14, wherein the controller controls movement of the laser beam to expose each of the plurality of dice.

16. The annealing system recited in claim 14, and further comprising a platform to support the wafer, and wherein the controller controls movement of the platform to expose each of the plurality of dice.

17. The annealing system recited in claim 16, wherein the controller also controls movement of the laser beam, and wherein the plurality of dice are exposed through a combination of movements of the wafer and of the laser beam.

18. The annealing system recited in claim 14, wherein the controller controls one or more parameters of the laser beam from the group consisting of beam size, beam intensity, beam shape, and distance of the laser from the wafer.

19. A computer-readable medium containing computer instructions for instructing a processor to perform a method of annealing an integrated circuit wafer comprising a plurality of dice arranged in at least one row on the wafer, each die having a width, the processor forming an element in an annealing system comprising a laser to generate a laser beam, and a controller to control the exposure of the wafer to the laser beam, wherein the instructions comprise:

controlling a continuous wave laser beam that is directed at the wafer; and controlling relative movement of the laser beam with respect to the wafer to scan the laser beam in a single pass across the wafer to expose at least the entire width of each of the plurality of dice to the laser beam in one non-interrupted scan of the plurality of dice.

20. The computer-readable medium recited in claim 19, wherein the plurality of dice are arranged in a plurality of rows and columns on the wafer, and wherein in controlling, the instructions cause the relative movement to be from the group consisting of continuous back-and-forth movement along different rows of dice, continuous back-and-forth movement along different multiples of rows of dice, continuous movement along rows and columns in a spiral pattern, continuous sweep movement concurrently over a subset of the plurality of dice, and continuous movement along a portion of the wafer comprising more than one die followed by an interruption of the laser beam while the relative movement is controlled to move the laser beam to a different portion of the wafer.

21. The computer-readable medium recited in claim 19, wherein the controller controls movement of the laser beam to expose each of the plurality of dice, and wherein in controlling, the instructions cause the relative movement to be produced by moving the laser beam.

22. The computer-readable medium recited in claim 19, wherein the controller controls movement of the wafer to expose each of the plurality of dice, and wherein in controlling, the instructions cause the relative movement to be produced by moving the wafer.

23. The computer-readable medium recited in claim 19, wherein the annealing system comprises a platform to support the wafer, wherein the controller controls movement of the laser beam and of the platform, and wherein in controlling, the instructions cause the relative movement to be produced by a combination of moving the laser beam and moving the platform.

24. The method recited in claim 1, wherein the plurality of dice comprise less than an entire row on the wafer.

25. The method recited in claim 1 wherein, in scanning, the entire width of each of the plurality of dice in more than one row is exposed.

26. The method recited in claim 1, wherein the plurality of dice are located in multiple rows on the wafer, and wherein, in scanning, the entire width of each of the plurality of dice in a first row is exposed and less than the width of each of the plurality of dice in a second row is exposed.

27. The method recited in claim 1, wherein the plurality of dice are located in a plurality of rows on the wafer, and wherein, after the single pass, all dice in the plurality of rows have been exposed. FIG. 8.

28. The method recited in claim 27, wherein the pass is made perpendicular to the plurality of rows.

* * * * *